US006804282B2

(12) United States Patent
Shigihara et al.

(10) Patent No.: US 6,804,282 B2
(45) Date of Patent: Oct. 12, 2004

(54) SEMICONDUCTOR LASER DEVICE

(75) Inventors: Kimio Shigihara, Tokyo (JP); Kazushige Kawasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/359,125

(22) Filed: Feb. 6, 2003

(65) Prior Publication Data

US 2004/0042520 A1 Mar. 4, 2004

(30) Foreign Application Priority Data

Aug. 27, 2002 (JP) ....................................... 2002-247096

(51) Int. Cl.[7] .......................... H01S 3/113; H01S 3/098; H01S 5/00; H01S 3/13; H01S 3/08

(52) U.S. Cl. ............................. 372/49; 372/11; 372/19; 372/43; 372/45; 372/99; 372/101; 372/108; 372/29.02

(58) Field of Search .............................. 372/43, 45, 49, 372/11, 19, 29.02, 99, 101, 108; 427/164

(56) References Cited

U.S. PATENT DOCUMENTS 5,031,186 A 7/1991 Takigawa et al.
6,343,088 B1 1/2002 Mungino et al.
6,487,227 B1 * 11/2002 Kuramachi .................. 372/49
2002/0176466 A1 * 11/2002 Yoon ........................... 372/49

FOREIGN PATENT DOCUMENTS

| | | |
|---|---|---|
| JP | 02-241075 | 9/1990 |
| JP | 10-186104 | 7/1998 |
| JP | 11-214799 | 8/1999 |

OTHER PUBLICATIONS

"Fiber Grating and Its Application", Akira Inoue, Journal of the Institute of Electronics, Information and Communication Engineers, vol. 85, No. 2, pp. 126–128, Feb. 2002.

* cited by examiner

*Primary Examiner*—Don Wong
*Assistant Examiner*—Armando Rodriguez
(74) *Attorney, Agent, or Firm*—Leydig, Voit & Mayer, Ltd.

(57) ABSTRACT

A multilayer film includes alternately laminated, a first film with a refractive index of $n_1$ and a second film with a refractive index of $n_2$, the multilayer film having the first film in contact with an end face of a semiconductor laser element. The first film and the second film satisfy relations expressed by the formulas $n_1<(n_c)^{1/2}$ and $n_2>(n_c)^{1/2}$. The reflectivity characteristic of the multilayer film has a 1 maximum at a wavelength $\lambda_1$ in a wavelength region and minimums at wavelengths $\lambda_2$ and $\lambda_3$ on a shorter-wavelength side and a longer-wavelength side of the wavelength $\lambda_1$, respectively.

7 Claims, 20 Drawing Sheets

SEMICONDUCTOR LASER DEVICE

BACKGROUND OF THE INVENTION

1. Field of the Invention

The present invention relates to a semiconductor laser device, and more particularly to a semiconductor laser device used as a light source for optical information processing, a signal source for optical communications, or an excitation light source for fiber amplifiers.

2. Background Art

FIG. 20 is a diagram of a fiber grating laser taken from the journal article "Fiber Grating and Its Applications" by Tohru Inoue, in IECE transactions, Vol. 85, No. 2, pp 126–128, February, 2002. In a fiber grating laser 52 shown in the figure, a fiber grating 54 having a reflectance of $R_{fg}$ is provided within an optical fiber 53. Light of a specific wavelength entering the optical fiber 53 is reflected by the fiber grating 54. On the other hand, a semiconductor laser 55 is configured such that its front end face 56 has a reflectance ($R_f$) corresponding to low reflection or no reflection, and its back end face 57 has a reflectance ($R_r$) corresponding to high reflection. Reference numeral 58 denotes the optical waveguide region of the semiconductor laser 55. In this arrangement, a resonator is formed between the fiber grating 54 and the back end face 57 of the semiconductor laser 55, thereby stabilizing the oscillation wavelength of the laser light.

Use of such a fiber grating laser, however, makes the structure of the device complicated. Furthermore, it is necessary to combine the semiconductor laser and the optical fiber, producing a coupling loss therebetween.

The present invention has been devised in view of the above problems. It is, therefore, an object of the present invention to provide a semiconductor laser device capable of stably extracting from its semiconductor laser element laser light whose wavelength exhibits only a small change, without using any fiber grating.

Other objects and advantages of the present invention will become apparent from the following description.

JP-A No. 10-186104 discloses a multilayer antireflective film whose reflectance curve has two separate bottoms (low reflectance points) and a peak therebetween in a required wavelength band. Further, JP-A No. 11-214799 discloses a multilayer film whose reflectance is $10^{-4}$% to 10% at the center wavelength and the reflection spectrum characteristic curve has minimum values on both sides of the center wavelength. Still further, JP-A No. 2-241075 discloses a semiconductor laser device in which a film whose reflectance depends on the wavelength is formed.

However, the multilayer antireflective film described in the JP-A No. 10-186104 was devised to obtain a low reflectance over a wide range of wavelengths, and therefore the oscillation of the semiconductor laser is suppressed at each of the two bottoms and the peak. The purpose of the present invention, on the other hand, is to stably extract from a semiconductor laser element itself laser light whose wavelength exhibits only a small change, without using any fiber grating. Furthermore, as described later, the multilayer films of the present invention are used to cause the semiconductor laser to oscillate at a wavelength $\lambda_1$ at which the reflectance is maximized. Therefore, the purpose and the effect of the present invention are different from those described in the above patent publication.

Further, the refractive indexes of first films for realizing the reflectance characteristics described in the above three patent publications are each larger than the square root of the effective refractive index $n_c$ of a respective semiconductor laser element. Therefore, these multilayer films are different from those of the present invention.

SUMMARY OF THE INVENTION

The features and advantages of the present invention may be summarized as follows.

According to one aspect, a semiconductor laser device comprises a semiconductor laser element having an effective refractive index of $n_c$, and a multilayer film formed on at least one of the two end faces of the semiconductor laser element. The multilayer film has a structure in which a first film with a refractive index of $n_1$ and a second film with a refractive index of $n_2$ are alternately laminated, the first film being formed such that the first film is in contact with the one of the two end faces. The refractive index n, and the refractive index $n_2$ satisfy relations expressed by the formulas, $n_1<(n_c)^{1/2}$ and $n_2>(n_c)^{1/2}$. A reflectivity characteristic of the multilayer film is such that a reflectivity of the multilayer film is maximized at a wavelength $\lambda_1$ in a predetermined wavelength region and minimized at wavelengths $\lambda_2$ and $\lambda_3$ on a shorter-wavelength side and a longer-wavelength side of the wavelength $\lambda_1$, respectively.

Other and further objects, features and advantages of the invention will appear more fully from the following description.

BRIEF DESCRIPTION OF THE DRAWINGS

FIG. 17 is a cross-sectional view of a semiconductor laser element according to the fifth embodiment.

DETAILED DESCRIPTION OF THE PREFERRED EMBODIMENTS

A multilayer film of the present invention has a structure in which a first film with a refractive index of $n_1$ and a second film with a refractive index of $n_2$ are alternately laminated, the first film being formed such that the first film is in contact with an end face of a semiconductor laser element.

Further according to the present invention, the multilayer film is made of a material having a refractive index smaller than the square root of the effective refractive index $n_c$ of the semiconductor laser element, that is, $(n_c)^{1/2}$, and another material having a refractive index larger than the square root of the effective refractive index $n_c$. That is, the refractive index $n_1$ of the first film and the refractive index $n_2$ of the second film each satisfy a relation expressed by formula (1) below.

$$n_1<(n_c)^{1/2}$$

$$n_2>(n_c)^{1/2} \tag{1}$$

Still further according to the present invention, the reflectivity of the multilayer film, configured as described above, is maximized at a wavelength $\lambda_1$ in a predetermined wavelength region and minimized at wavelengths $\lambda_2$ and $\lambda_3$ on the shorter-wavelength side and the longer-wavelength side of the wavelength $\lambda_1$, respectively. Therefore, for example, the multilayer film according to the present invention may be provided on the front end face of a semiconductor laser from which the laser light is extracted, and a film having an appropriately high reflectivity may be provided on the back end face facing the front end face. With this arrangement, the semiconductor laser can oscillate at the wavelength $\lambda_1$ at which the reflectivity is maximized. Furthermore, since the reflectivity is minimized at the wavelengths $\lambda_2$ and $\lambda_3$ each on a respective side of the wavelength $\lambda_1$, it is possible to oscillate the laser light in a stable single mode.

Figure 1:
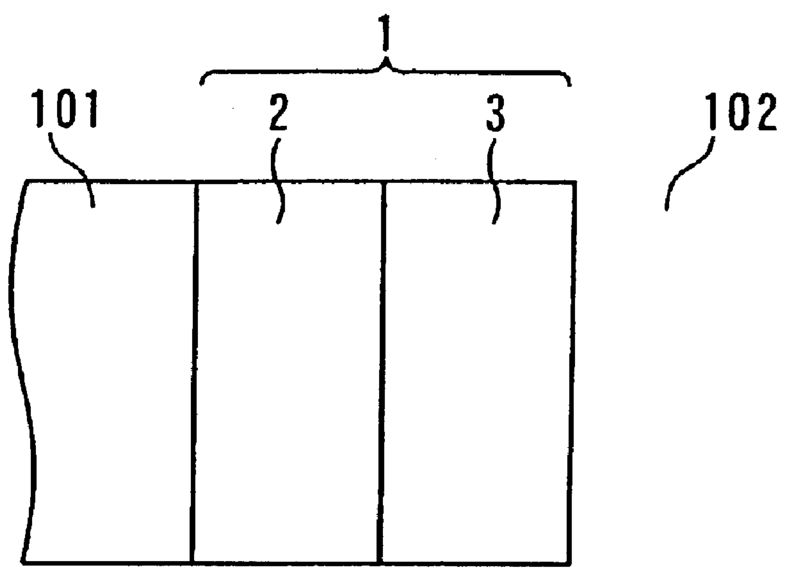
FIG. 1 is a cross-sectional view of a semiconductor laser element according to the present invention.

FIG. 1 is a cross-sectional view of a portion of a semiconductor laser element according to the present invention, the portion being a neighborhood of an end face of the semiconductor laser element. In the figure, a multilayer film 1 is formed on a surface of a semiconductor laser element 101 having an effective refractive index of $n_c$. The multilayer film 1 is made up of a first film 2 having a refractive index of $n_1$ and a film thickness of $d_1$ and a second film 3 having a refractive index of $n_2$ and a film thickness of $d_2$. An interface surface of the first film 2 is in close contact with, for example, the front end face of the semiconductor laser element 101. A surface of the second film 3, on the other hand, is in contact with exterior space (ambient atmosphere) 102 composed of air, nitrogen, or free space. The refractive index $n_0$ of the exterior space 102 is assumed to be 1.

Let $\phi_1$ and $\phi_2$ denote phase changes in the first film 2 and the second film 3, respectively, and $\lambda$ denote the wavelength of oscillation light emitted from the semiconductor laser element 101. The phase changes $\phi_1$ and $\phi_2$ are expressed by formulas (2) and (3) below, respectively.

$$\phi_1=(2\pi/\lambda)n_1d_1 \tag{2}$$

$$\phi_2=(2\pi/\lambda)n_2d_2 \tag{3}$$

Then, the amplitude reflectivity r is expressed by formula (4) below. It should be noted that the symbol "i" in formula (4) indicates the imaginary unit.

$$r=\frac{(n_c-1)\cos\phi_1\cos\phi_2+\{(n_1/n_2)-(n_2n_c/n_1)\}\sin\phi_1\sin\phi_2-i\{(n_c/n_2-n_2)\cos\phi_1\sin\phi_2+(n_c/n_1-n_1)\sin\phi_1\cos\phi_2\}}{(n_c+1)\cos\phi_1\cos\phi_2-[(n_2n_c/n_1)+(n_1/n_2)\}\sin\phi_1\sin\phi_2-i\{(n_c/n_2+n_2)\cos\phi_1\sin\phi_2+(n_c/n_1+n_1)\sin\phi_1\cos\phi_2\}} \tag{4}$$

The power reflectivity R, on the other hand, is expressed as $|r|^2$. The power reflectivity R is reduced to zero when formulas (5) and (6) below are satisfied.

$$n_c-1+\{(n_1/n_2)-(n_2n_c/n1)\}\tan\phi_1\tan\phi_2=0 \tag{5}$$

$$\{(n_c/n_1)-n_1\}\tan\phi_1+\{(n_c/n_2)-n_2\}\tan\phi_2=0 \tag{6}$$

For example, assume the following: the effective refractive index $n_c$ of the semiconductor laser element 101 is 3.37; the first film 2 is formed of aluminum oxide ($Al_2O_3$) having a refractive index ($n_1$) of 1.62; and the second film 3 is formed of tantalum pentoxide ($Ta_2O_5$) having a refractive index ($n_2$) of 2.057. Further assume that the oscillation wavelength $\lambda$ of the semiconductor laser element 101 is 980 nm. In such a case, no reflection occurs when the film thicknesses of the first film 2 and the second film 3 are set to 71.34 nm and 86.20 nm, respectively.

Description will be made below of cases in which a plurality of multilayer films each made up of a film with a low refractive index and a film with a high refractive index are alternately laminated.

First of all, description will be made of a multilayer film obtained as a result of laminating two (sub-) multilayer films each made up of a film having a low refractive index and a film having a high refractive index.

Figure 2:
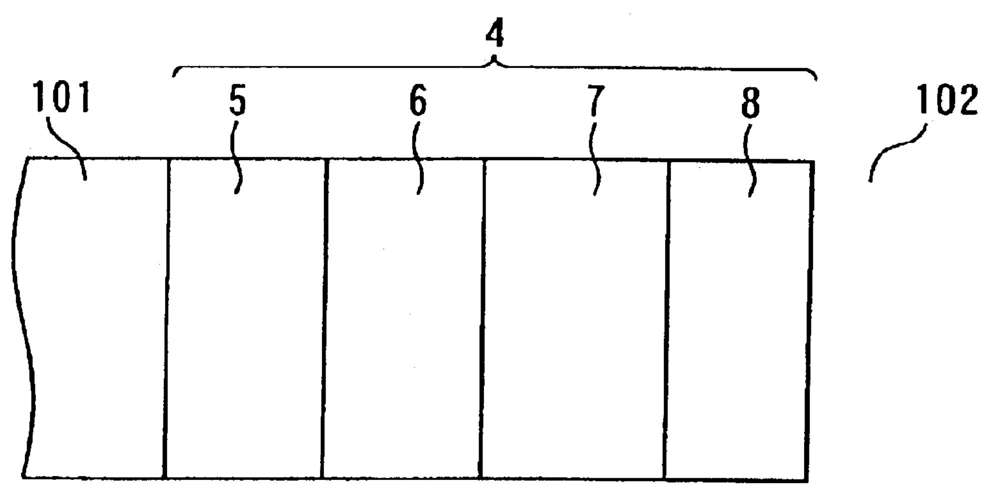
FIG. 2 is a cross-sectional view of a semiconductor laser element according to the present invention.

FIG. 2 is a cross-sectional view of a portion of a semiconductor laser element according to the present invention, the portion being a neighborhood of an end face of the semiconductor laser element. In the figure, a multilayer film 4 is formed on a surface of a semiconductor laser element 101 having an effective refractive index of $n_c$. The multilayer film 4 comprises: a first film 5 having a refractive index of $n_1$ and a film thickness of $Ad_1$; a second film 6 having a refractive index of $n_2$ and a film thickness of $Ad_2$; a third film 7 having a refractive index of $n_1$ and a film thickness of $Bd_1$; and a fourth film 8 having a refractive index of $n_2$ and a film thickness of $Bd_2$; where the symbols "A" and "B" indicate variables.

In the multilayer film 4, an interface surface of the first film 5 is in close contact with, for example, the front end face of the semiconductor laser element 101. A surface of the fourth film 8, on the other hand, is in contact with exterior space (ambient temperature) 102 composed of air, nitrogen, or free space. The refractive index $n_0$ of the exterior space 102 is assumed to be 1.

The nonreflective conditions for the configuration of the multilayer film 4 may be derived in the same manner as in the above case. That is, the film thicknesses of the first to fourth films are each determined by setting the parameters $d_1$ and $d_2$ so that the real part and the imaginary part of the amplitude reflectance r expressed by formula (7) below are equal to zero.

$$r = \frac{(m_{11} + m_{12})n_c - (m_{21} + m_{22})}{(m_{11} + m_{12})n_c - (m_{21} + m_{22})} \quad (7)$$

$$\begin{bmatrix} m_{11} & m_{12} \\ m_{21} & m_{22} \end{bmatrix} =$$

$$\begin{bmatrix} \cos A\phi_1 & -(i/n_1)\sin A\phi_1 \\ -in_1\sin A\phi_1 & \cos A\phi_1 \end{bmatrix}\begin{bmatrix} \cos A\phi_2 & -(i/n_2)\sin A\phi_2 \\ -in_2\sin A\phi_2 & \cos A\phi_2 \end{bmatrix}\times$$

$$\begin{bmatrix} \cos B\phi_1 & -(i/n_1)\sin B\phi_1 \\ -in_1\sin B\phi_1 & \cos B\phi_1 \end{bmatrix}\begin{bmatrix} \cos B\phi_2 & -(i/n_2)\sin B\phi_2 \\ -in_2\sin B\phi_2 & \cos B\phi_2 \end{bmatrix}$$

For example, assume the following: the effective refractive index $n_c$ of the semiconductor laser element 101 is 3.37; the first film 5 and the third film 7 are formed of aluminum oxide ($Al_2O_3$) having a refractive index ($n_1$) of 1.62; the second film 6 and the fourth film 8 are formed of tantalum pentoxide ($Ta_2O_5$) having a refractive index ($n_2$) of 2.057; and the oscillation wavelength λ of the semiconductor laser element 101 is 980 nm. Further assume that A=1.2 and B=0.8. In such a case, no reflection occurs when $d_1$=319.91 nm and $d_2$=33.40 nm.

First Embodiment

A multilayer film of a first embodiment is made up of seven films formed in layers each made of aluminum oxide ($Al_2O_3$) having a low refractive index or tantalum pentoxide ($Ta_2O_5$) having a high refractive index.

Figure 3:
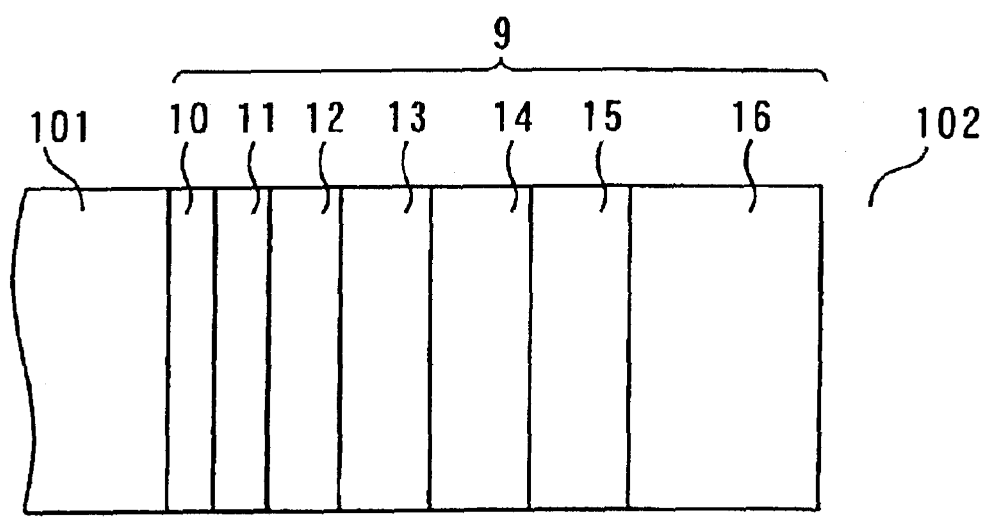
FIG. 3 is a cross-sectional view of a semiconductor laser element according to the first embodiment.

FIG. 3 is a cross-sectional view of a portion of a semiconductor laser element according to the present embodiment, the portion being a neighborhood of an end face of the semiconductor laser element. In the figure, a multilayer film 9 is formed on a surface of a semiconductor laser element 101 having an effective refractive index of $n_c$. The multilayer film 9 comprises: a first film 10 having a refractive index of $n_2$ and a film thickness of $Od_2$; a second film 11 having a refractive index of $n_1$ and a film thickness of $Ad_1$; a third film 12 having a refractive index of $n_2$ and a film thickness of $Ad_2$; a fourth film 13 having a refractive index of $n_1$ and a film thickness of $Bd_1$; a fifth film 14 having a refractive index of $n_2$ and a film thickness of $Bd_2$; a sixth film 15 having a refractive index of $n_1$ and a film thickness of $Cd_1$; and a seventh film 16 having a refractive index of $n_2$ and a film thickness of $Cd_2$; where the symbols "O", "A", "B", and "C" indicate variables.

In the multilayer film 9, an interface surface of the first film 10 is in close contact with the front end face of the semiconductor laser element 101. A surface of the seventh film 16, on the other hand, is in contact with exterior space (ambient atmosphere) 102 composed of air, nitrogen, or free space. The refractive index no of the exterior space 102 is assumed to be 1. Furthermore, the value of the refractive index $n_2$ of the first film 10, the third film 12, the fifth film 14, and the seventh film 16 is assumed to be different from that of the refractive index $n_1$ of the second film 11, the fourth film 13, and the sixth film 15 such that $n_1>n_2$. Thus, the multilayer film 9 of the present embodiment has a structure in which three (sub-) multilayer films are laminated on a film with a low refractive index, each (sub-) multilayer film including a film with a high refractive index and a film with a low refractive index.

Figure 4:
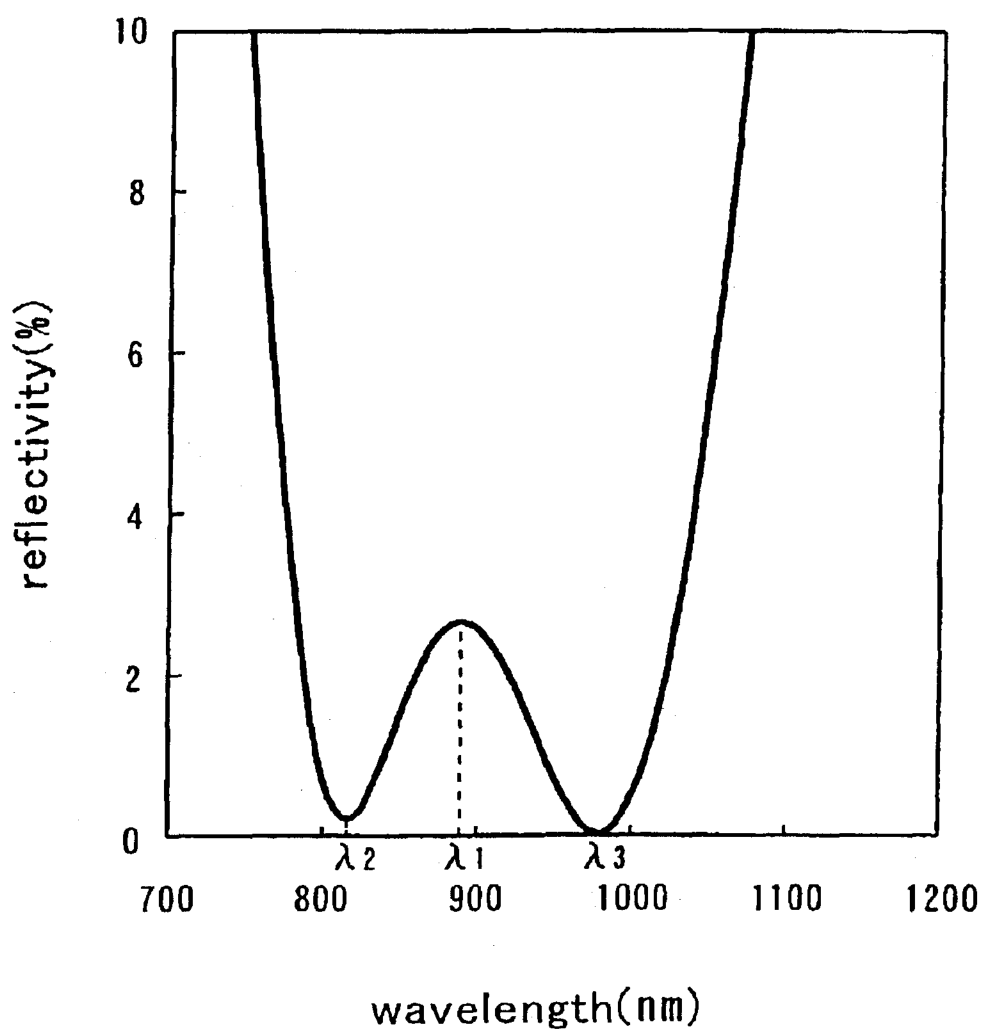
FIG. 4 shows wavelength dependence of reflectivity of a multilayer film according to the first embodiment.

The nonreflective conditions for the multilayer film of the present embodiment are derived in the same manner as in the above cases. For example, assume the following: the effective refractive index $n_c$ of the semiconductor laser element 101 is 3.37; the second film 11, the fourth film 13, and the sixth film 15 are formed of tantalum pentoxide ($Ta_2O_5$) having a refractive index ($n_2$) of 2.057; and the first film 10, the third film 12, the fifth film 14, and the seventh film 16 are formed of aluminum oxide ($Al_2O_3$) having a refractive index ($n_1$) of 1.62. Further assume that O=0.15, A=2.5, B=2.5, and C=1.75. In such a case, no reflection occurs at the wavelength $\lambda_3$ (980 nm) when the phase change $\phi_1$ of tantalum pentoxide ($Ta_2O_5$) and the phase change $\phi_2$ of aluminum oxide ($Al_2O_3$) are 0.302723 and 0.961829, respectively. The reflectivity has a maximum value at the wavelength $\lambda_1$ (890 nm). The parameters $d_1$ to $d_7$ for the first to seventh films, respectively, are such that $d_1$=13.89 nm, $d_2$=57.38 nm, $d_3$=231.51 nm, $d_4$=57.38 nm, $d_5$=231.51 nm, $d_6$=40.17 nm, and $d_7$=162.06 nm. FIG. 4 shows the wavelength dependence of the reflectivity obtained with the above arrangement.

As shown in FIG. 4, the reflectivity of the multilayer film of the present embodiment is maximized at the wavelength $\lambda_1$ (890 nm), reaching a value of 1% or more. The reflectivity then rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 4, the reflectivity is reduced to zero at the wavelength $\lambda_3$, and to less than 1% at the wavelength $\lambda_2$.

Therefore, the multilayer film of the present embodiment may be provided on the front end face of a semiconductor laser element, and a film having an appropriately high reflectivity may be provided on the back end face facing the front end face. With this arrangement, the semiconductor laser can stably oscillate around the wavelength 890 nm.

Furthermore, the reflectivity of the multilayer film of the present embodiment has a large value (is maximized) at a specific wavelength set in a low-reflective wavelength region, making it possible to reflect light of this specific wavelength. The reflected light can be amplified to generate laser oscillation by further reflecting the light within the semiconductor laser element repeatedly. Thus, it is possible to stably extract from the semiconductor laser element itself laser light whose wavelength exhibits only a small change, without using any fiber grating.

The multilayer film of the present embodiment may be applied to a semiconductor laser whose oscillation wavelength λ is different (from that in the above example), as follows. In the case of a semiconductor laser whose oscillation wavelength λ is 980 nm, the reflectivity of the multilayer film may be set such that it is maximized at the wavelength 980 nm.

Figure 5:
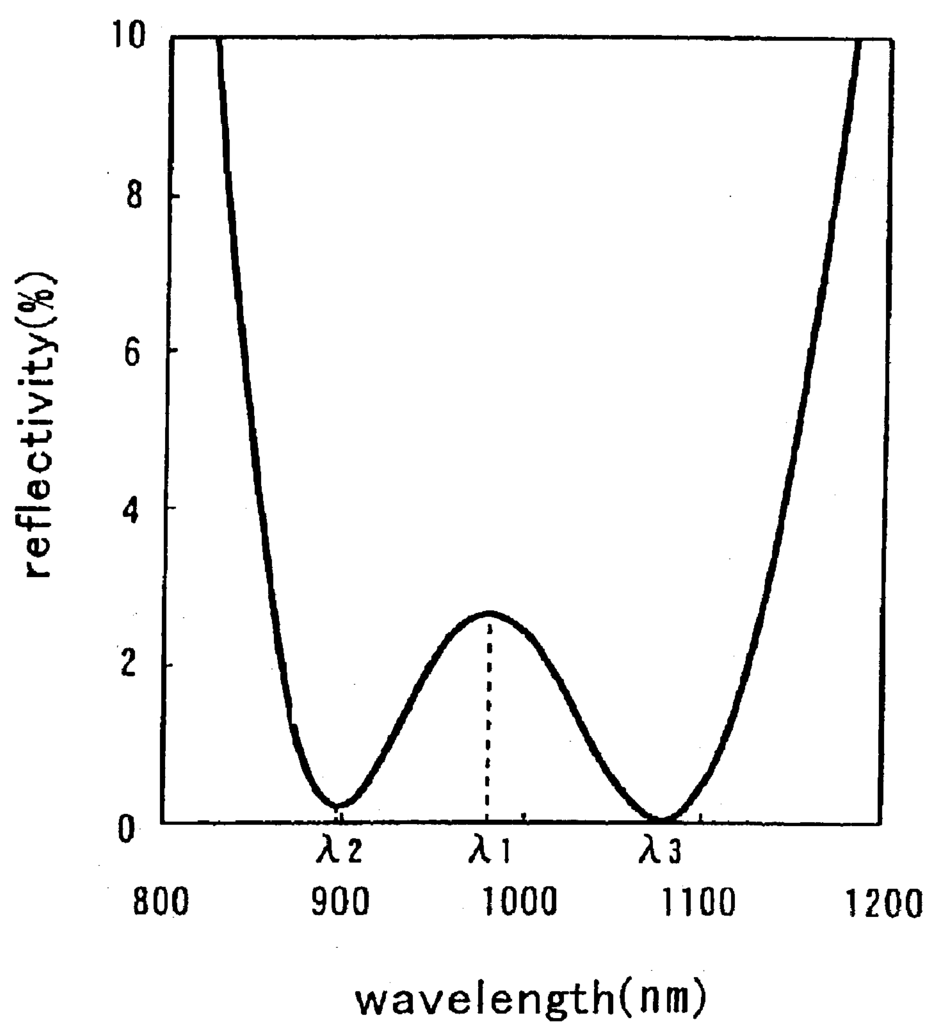
FIG. 5 shows wavelength dependence of reflectivity of a multilayer film according to the first embodiment.

Specifically, the phase change $\phi_1$ of the tantalum pentoxide $(Ta_2O_5)_5$ and the phase change $\phi_2$ of the aluminum oxide ($Al_2O_3$) are set such that $\phi_1$=0.302723 and $\phi_2$=0.961829. With this arrangement, the reflectivity can be maximized at the wavelength $\lambda_1$ (980 nm) as shown in FIG. 5. At that time, the reflectivity is approximately 2.6%. As in the above example, the reflectivity rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 5, the reflectivity is reduced to zero at the wavelength $\lambda_3$, and to less than 1% at the wavelength $\lambda_2$. it should be noted that the parameters $d_1$ to $d_7$ for the first to seventh films, respectively, are such that $d_1$=15.29 nm, $d_2$=63.18 nm, $d_3$=254.90 nm, $d_4$=63.18 nm, $d_5$=254.90 nm, $d_6$=44.23 nm, and $d_7$=178.43 nm.

Further, the value of the reflectivity at the wavelength $\lambda_1$ which corresponds to the oscillation wavelength λ of the semiconductor laser, may be increased as follows.

Let O=0.15, A=2.7, B=2.6, and C=1.65. In such a case, no reflection occurs at the wavelength $\lambda_3$ (980 nm) when the phase change $\phi_1$ of tantalum pentoxide ($Ta_2O_5$) and the phase change $\phi_2$ of aluminum oxide ($Al_2O_3$) are 0.674125 and 1.29275, respectively. The reflectivity has a maximum value at the wavelength $\lambda_1$ (899 nm).

Figure 6:
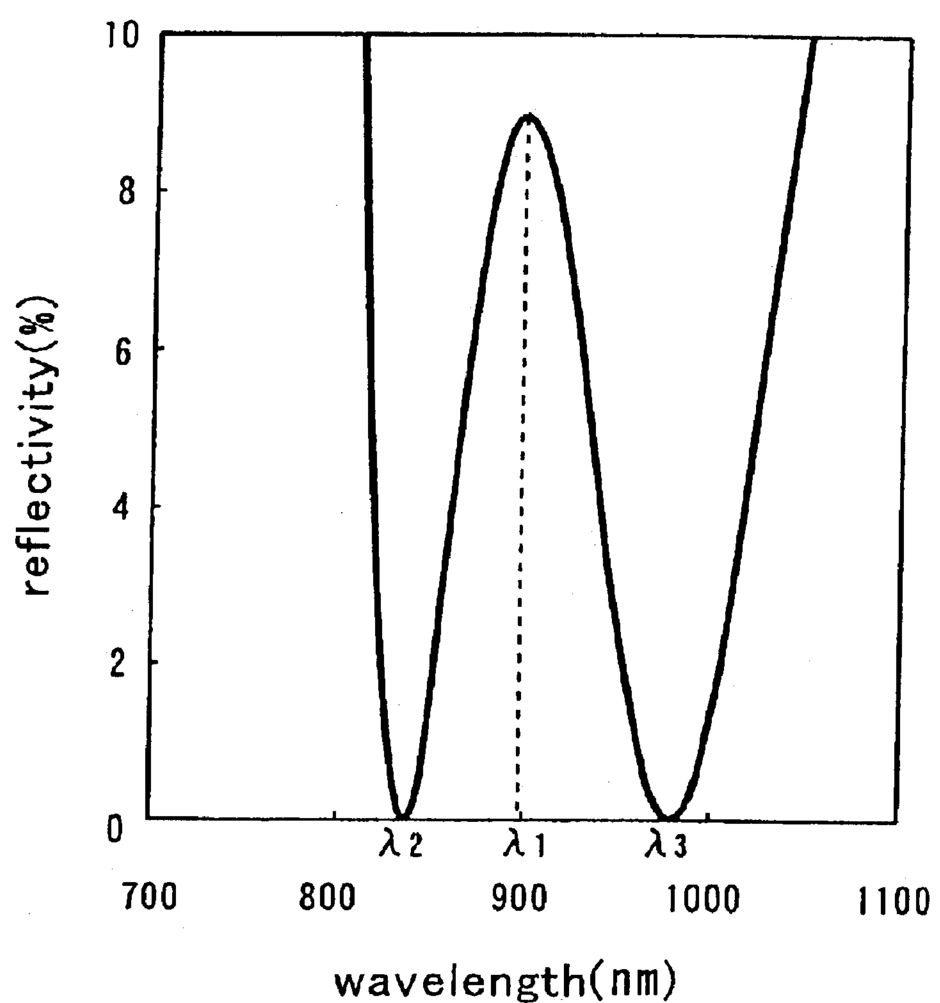
FIG. 6 shows wavelength dependence of reflectivity of a multilayer film according to the first embodiment.

FIG. 6 shows the wavelength dependence of the reflectivity of the above example. As shown in the figure, the value of the reflectivity at the wavelength $\lambda_1$ (899 nm) is approximately 9%, which is larger than the values obtained by the examples in FIGS. 4 and 5. In this case, the parameters $d_1$ to $d_7$ for the first to seventh films, respectively, are such that $d_1$=18.67 nm, $d_2$=138.01 nm, $d_3$=336.06 nm, $d_4$=132.90 nm, $d_5$=323.61 nm, $d_6$=84.34 nm, and $d_7$=205.37 nm.

When the multilayer film of the present embodiment is applied to a semiconductor laser by forming it on the front end face of the semiconductor laser, the maximum reflectivity value obtained at the wavelength $\lambda_1$ is preferably set to approximately between 10% and 20%. If the reflectivity is too low, it is difficult to stably extract the laser light. If the reflectivity is too high, on the other hand, the amount of light which can be extracted becomes small. Both cases are undesirable. Further, the reflectivity is preferably set such that it has a peak as narrow as possible at the wavelength $\lambda_1$. That is, it is preferable to form a reflectivity curve in which the reflectivity rapidly decreases when the wavelength is shifted from the wavelength $\lambda_1$ even by a small amount.

On the other hand, each minimum value of the reflectivity is preferably set to zero (that is, no reflection). Especially, the reflectivity values at both wavelengths $\lambda_2$ and $\lambda_3$ are preferably set to zero. Furthermore, it is desirable that the shapes of the downwardly-convex reflectivity curve sections including the wavelength $\lambda_2$ or $\lambda_3$ be as wide as possible. That is, the reflectivity is preferably set such that it gradually changes as the wavelength is changed from the wavelength $\lambda_2$ or $\lambda_3$, which is not the case with the reflectivity change around the wavelength $\lambda_1$.

Figure 7:
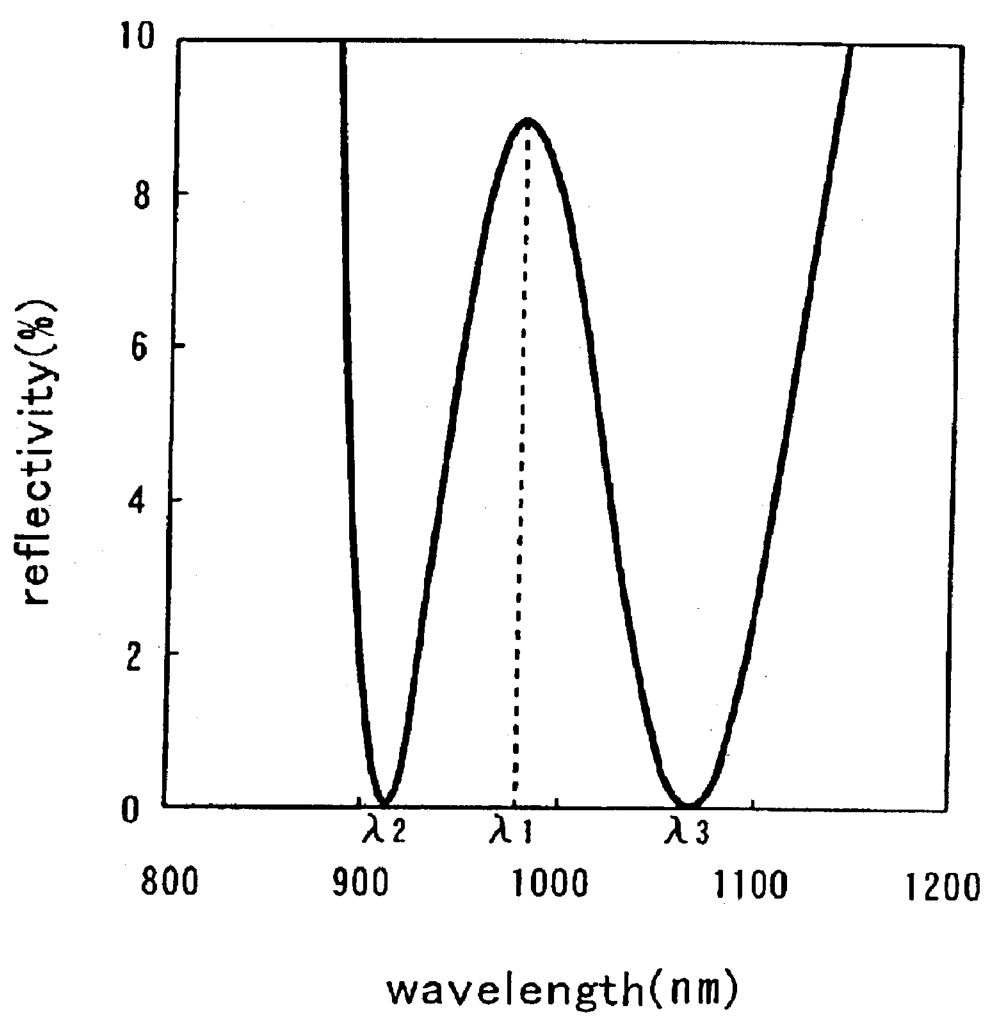
FIG. 7 shows wavelength dependence of reflectivity of a multilayer film according to the first embodiment.

Further, to maximize the reflectivity at the wavelength 980 nm, the phase change $\phi_1$ of the tantalum pentoxide $(Ta_2O_5)_5$ and the phase change $\phi_2$ of the aluminum oxide ($Al_2O_3$) may be set such that $\phi_1$=0.674125 and $\phi_2$=1.29275. In this case, no reflection occurs at the wavelength 1068 nm. With this arrangement, it is possible to maximize the reflectivity at the wavelength $\lambda_1$ (980 nm), as shown in FIG. 7. In this case, the parameters $d_1$ to $d_7$ for the first to seventh films, respectively, are such that $d_1$=20.35 nm, $d_2$=150.41 nm, $d_3$=366.23 nm, $d_4$=144.83 nm, $d_5$=352.67 nm, $d_6$=91.91 nm, and $d_7$=223.81 nm.

In the above description of the present embodiment, a multilayer film is formed on the front end face of a semiconductor laser element. However, the present invention is not limited to this specific arrangement. The multilayer film of the present embodiment can be applied to any arrangement employed to stably extract light of a specific wavelength. For example, the multilayer film may be formed on only the back end face of a semiconductor laser element, or it may be formed on both the front and the back end faces, depending on the application.

The multilayer film of the present embodiment can be formed on an end face of a semiconductor laser element by use of, for example, the EB (Electron Beam) deposition method, the sputtering method, the thermal CVD method, etc. The multilayer film of the present embodiment has good adhesion to an end face of a semiconductor laser and does not exhibit the problem of peel-off, etc. even after long use. Furthermore, the multilayer film has good resistance to heat generated due to absorption of light.

Second Embodiment

A multilayer film of a second embodiment is made up of nine films formed in layers each made of aluminum oxide ($Al_2O_3$) having a low refractive index and tantalum pentoxide ($Ta_2O_5$) having a high refractive index.

Figure 8:
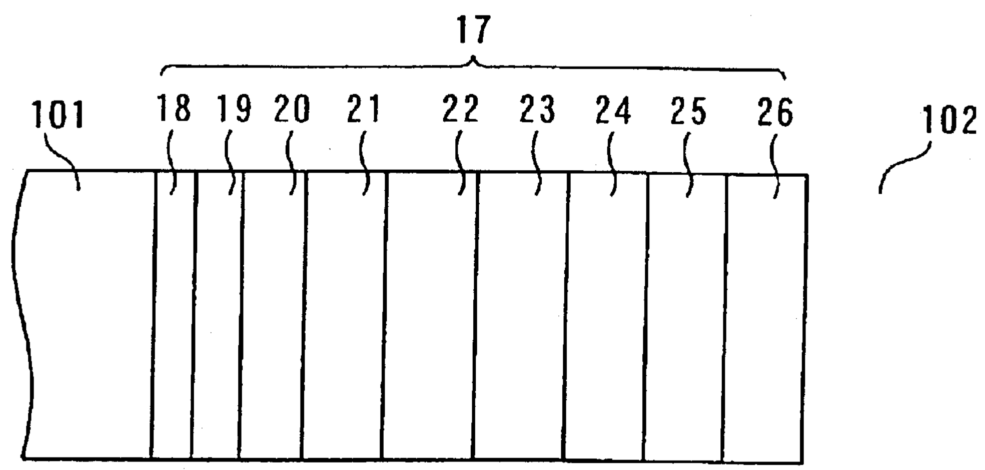
FIG. 8 is a cross-sectional view of a semiconductor laser element according to the second embodiment.

FIG. 8 is a cross-sectional view of a portion of a semiconductor laser element according to the present embodiment, the portion being a neighborhood of an end face of the semiconductor laser element. In the figure, a multilayer film 17 is formed on a surface of a semiconductor laser element 101 having an effective refractive index of $n_c$. The multilayer film 17 comprises: a first film 18 having a refractive index of $n_2$ and a film thickness of $Od_2$; a second film 19 having a refractive index of $n_1$ and a film thickness of $Ad_1$; a third film 20 having a refractive index of $n_2$ and a film thickness of $Ad_2$; a fourth film 21 having a refractive index of $n_1$ and a film thickness of $Bd_1$; a fifth film 22 having a refractive index of $n_2$ and a film thickness of $Bd_2$; a sixth film 23 having a refractive index of $n_1$ and a film thickness of $Cd_1$; a seventh film 24 having a refractive index of $n_2$ and a film thickness of $Cd_2$; an eighth film 25 having a refractive index of $n_1$ and a film thickness of Dd1; and a ninth film 26 having a refractive index of $n_2$ and a film thickness of Dd2; where the symbols "O", "A", "B", "C", and "D" indicate variables.

In the multilayer film 17, an interface surface of the first film 18 is in close contact with the front end face of the semiconductor laser element 101. A surface of the ninth film 26, on the other hand, is in contact with exterior space (ambient atmosphere) 102 composed of air, nitrogen, or free space. The refractive index no of the exterior space 102 is assumed to be 1. Furthermore, the value of the refractive index $n_2$ of the first film 18, the third film 20, the fifth film 22, the seventh film 24, and the ninth film 26 is assumed to be different from that of the refractive index $n_1$ of the second film 19, the fourth film 21, the sixth film 23, the eighth film 25 such that $n_1>n_2$. Thus, the multilayer film 17 of the present embodiment has a structure in which four (sub-) multilayer films are laminated on a film with a low refractive index, each (sub-) multilayer film including a film with a high refractive index and a film with a low refractive index.

Figure 9:
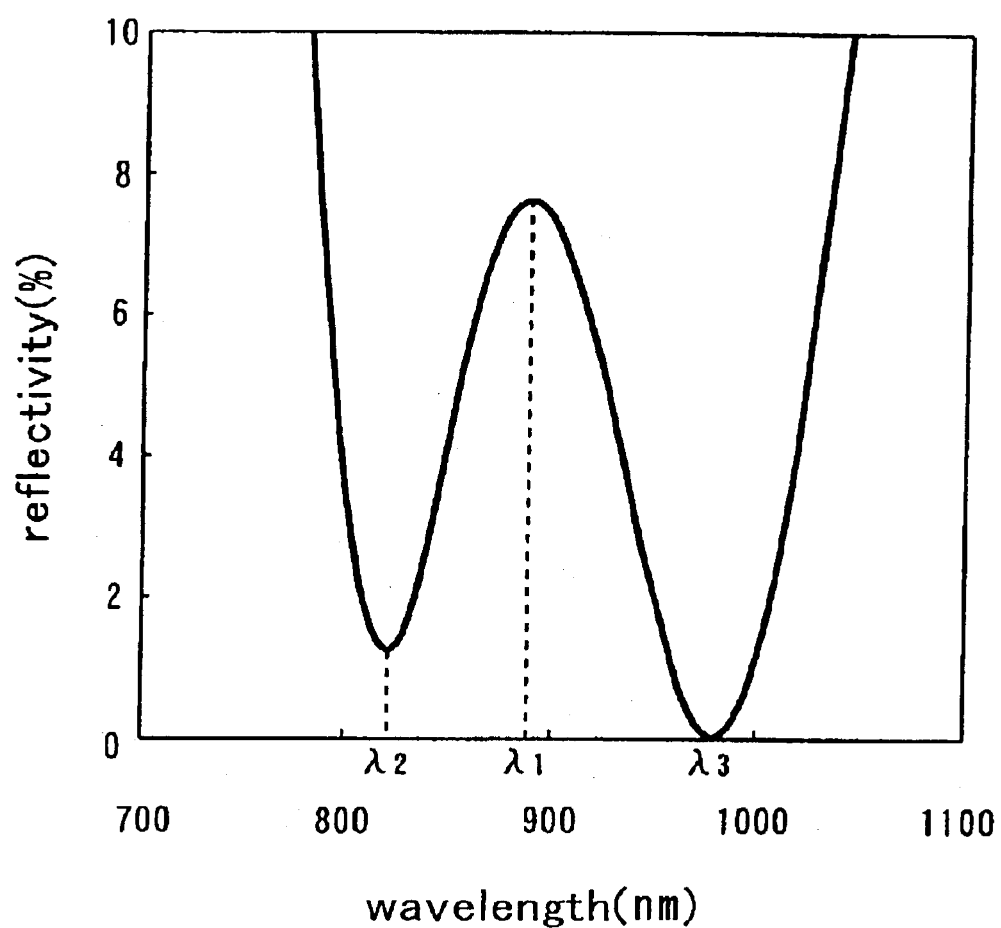
FIG. 9 shows wavelength dependence of reflectivity of a multilayer film according to the second embodiment.

The nonreflective conditions for the multilayer film of the present embodiment are derived in the same manner as in the above cases. For example, assume the following: the effective refractive index $n_c$ of the semiconductor laser element 101 is 3.37; the second film 19, the fourth film 21, the sixth film 23, and the eighth film 25 are formed of tantalum pentoxide ($Ta_2O_5$) having a refractive index ($n_2$) of 2.057; and the first film 18, the third film 20, the fifth film 22, the seventh film 24, and the ninth film 26 are formed of aluminum oxide ($Al_2O_3$) having a refractive index ($n_1$) of 1.62. Further assume that O=0.15, A=2.7, B=2.6, C=1.65, and D=2.0. In such a case, no reflection occurs at the wavelength $\lambda_3$ (980 nm) when the phase change $\phi_1$ of tantalum pentoxide ($Ta_2O_5$) and the phase change $\phi_2$ of aluminum oxide ($Al_2O_3$) are 0.189374 and 1.07147, respectively. The reflectivity has a maximum value at the wavelength $\lambda_1$ (891 nm). The parameters $d_1$ to $d_9$ for the first to ninth films, respectively, are such that $d_1$=15.47 nm, $d_2$=38.77 nm, $d_3$=278.53 nm, $d_4$=37.33 nm, $d_5$=268.22 nm, $d_6$=23.69 nm, $d_7$=170.21 nm, $d_8$=28.72 nm, and $d_9$=206.32 nm. FIG. 9 shows the wavelength dependence of the reflectivity obtained with the above arrangement.

As shown in FIG. 9, the reflectivity of the multilayer film of the present embodiment is maximized at the wavelength $\lambda_1$ (891 nm), reaching a value of 7% or more. The reflectivity then rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 9, the reflectivity is reduced to zero at the wavelength $\lambda_3$, and to approximately 1% at the wavelength $\lambda_2$.

Therefore, the multilayer film of the present embodiment may be provided on the front end face of a semiconductor laser element, and a film having an appropriately high reflectivity may be provided on the back end face facing the front face. With this arrangement, the semiconductor laser can stably oscillate around the wavelength 891 nm.

Furthermore, the reflectivity of the multilayer film of the present embodiment has a large value (is maximized) at a specific wavelength set in a low-reflective wavelength region, making it possible to reflect light of this specific wavelength. The reflected light can be amplified to generate laser oscillation by further reflecting the light within the semiconductor laser element repeatedly. Thus, it is possible to stably extract from the semiconductor laser element itself laser light whose wavelength exhibits a small change, without using any fiber grating.

The multilayer film of the present embodiment may be applied to a semiconductor laser whose oscillation wavelength $\lambda$ is different (from that in the above example), as follows. In the case of a semiconductor laser whose oscillation wavelength $\lambda$ is 980 nm, the reflectivity of the multilayer film may be set such that it is maximized at the wavelength 980 nm.

Figure 10:
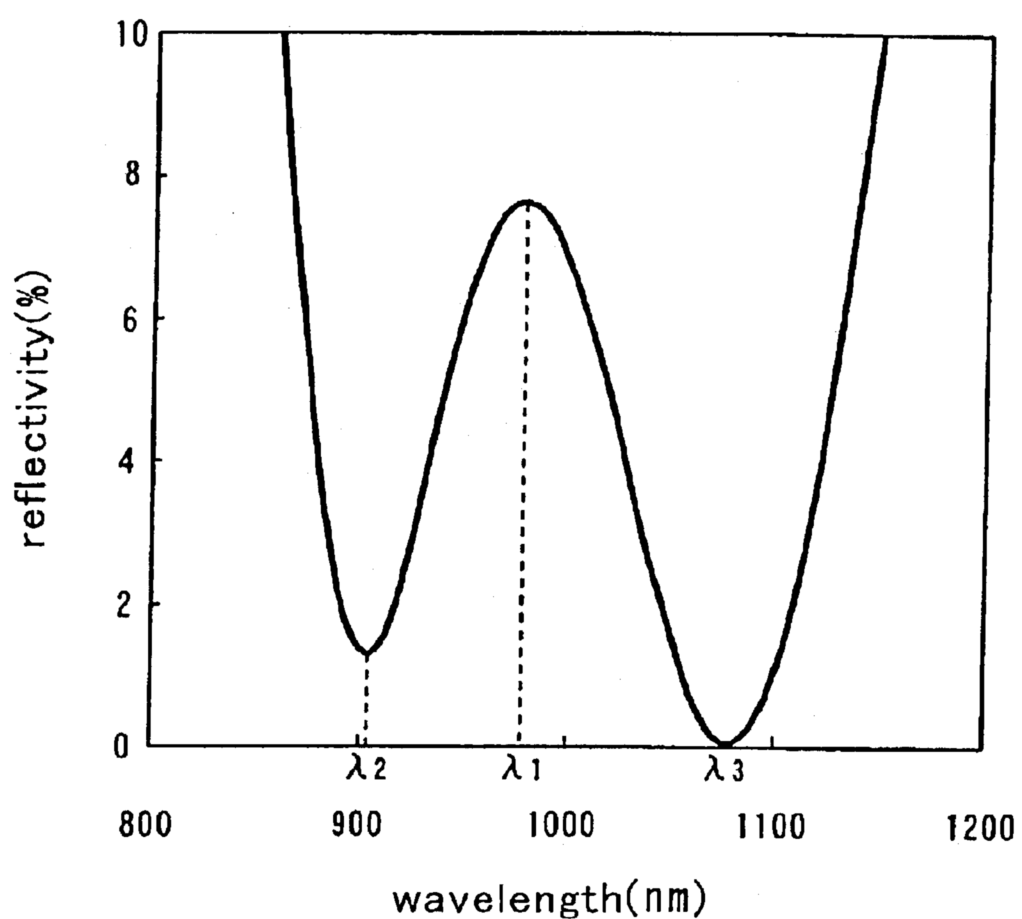
FIG. 10 shows wavelength dependence of reflectivity of a multilayer film according to the second embodiment.

Specifically, the phase changed $\phi_1$ of the tantalum pentoxide ($Ta_2O_5$ )$_5$ and the phase change $\phi_2$ of the aluminum oxide ($Al_2O_3$) are set such that $\phi_1$=0.189374 and $\phi_2$=1.07147. With this arrangement, the reflectivity can be maximized at the wavelength $\lambda_1$ (980 nm) as shown in FIG. 10. As in the above example, the reflectivity rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 10, the reflectivity is reduced to zero at the wavelength $\lambda_3$, and to approximately 1% at the wavelength $\lambda_2$. It should be noted that the parameters $d_1$ to $d_9$ for the first to ninth films, respectively, are such that $d_1$=17.02 nm, $d_2$=42.65 nm, $d_3$=306.38 nm, $d_4$=41.07 nm, $d_5$=295.04 nm, $d_6$=26.06 nm, $d_7$=187.24 nm, $d_8$=31.59 nm, and $d_9$=226.95 nm.

When the multilayer film of the present embodiment is applied to a semiconductor laser element by forming it on the front end face of the semiconductor laser element, the maximum reflectivity value obtained at the wavelength λ1 is preferably set to approximately between 10% and 20%. If the reflectivity is too low, it is difficult to stably extract the laser light. If the reflectivity is too high, on the other hand, the amount of light which can be extracted becomes small. Both cases are undesirable. Further, the reflectivity is preferably set such that it has a peak as narrow as possible at the wavelength $\lambda_1$. That is, it is preferable to form a reflective curve in which the reflectivity rapidly decreases when the wavelength is shifted from the wavelength $\lambda_1$ even by a small amount.

On the other hand, each minimum value of the reflectivity is preferably set to zero (that is, no reflection). Especially, the reflectivity values at both wavelengths $\lambda_2$ and $\lambda_3$ are preferably set to zero. Furthermore, it is desirable that the shapes of the downwardly-convex reflectivity curve sections including the wavelength $\lambda_2$ or $\lambda_3$ be as wide as possible. That is, the reflectivity is preferably set such that it gradually changes as the wavelength is changed from the wavelength $\lambda_2$ or $\lambda_3$, which is not the case with the reflectivity change around the wavelength $\lambda_1$.

In the above description of the present embodiment, a multilayer film is formed on the front end face of a semiconductor laser element. However, the present invention is not limited to this specific arrangement. The multilayer film of the present embodiment can be applied to any arrangement employed to stably extract light of a specific wavelength. For example, the multilayer film may be formed on only the back end face of a semiconductor laser element, or it may be formed on both the front and the back end faces, depending on the application.

The multilayer film of the present embodiment can be formed on an end face of a semiconductor laser element by use of, for example, the EB (Electron Beam) deposition method, the sputtering method, the thermal CVD method, etc. The multilayer film of the present embodiment has good adhesion to an end face of a semiconductor laser element and does not exhibit the problem of peel-off, etc. even after long use. Furthermore, the multilayer film has good resistance to heat generated due to absorption of light.

Third Embodiment

A multilayer film of a third embodiment is made up of seven films formed in layers each made of aluminum oxide ($Al_2O_3$) having a low refractive index or silicon (Si) having a high refractive index.

Figure 11:
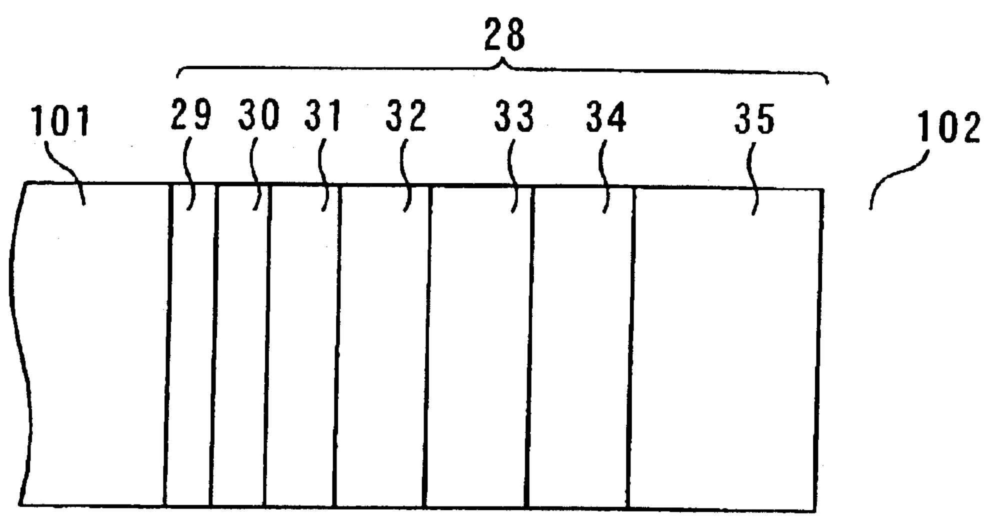
FIG. 11 is a cross-sectional view of a semiconductor laser element according to the third embodiment.

FIG. 11 is a cross-sectional view of a portion of a semiconductor laser element according to the present embodiment, the portion being a neighborhood of an end face of the semiconductor laser element. In the figure, a multilayer film 28 of the present embodiment is formed on a surface of a semiconductor laser element 101 having an effective refractive index of $n_c$. The multilayer film 28 comprises first, second, third, fourth, fifth, sixth, and seventh films. The first film 29 is an aluminum oxide ($Al_2O_3$) film having a refractive index of 1.62 and a film thickness of $Od_2$; the second film 30 is a silicon (Si) film having a refractive index of 2.954 and a film thickness of $Ad_1$; the third film 31 is an aluminum oxide ($Al_2O_3$) film having a refractive index of 1.62 and a film thickness of $Ad_2$; the fourth film 32 is a silicon (Si) film having a refractive index of 2.954 and a film thickness of $Bd_1$; the fifth film 33 is an aluminum oxide ($Al_2O_3$) film having a refractive index of 1.62 and a film thickness of $Bd_2$; the sixth film 34 is a silicon (Si) film having a refractive index of 2.954 and a film thickness of $Cd_1$; and the seventh film 35 is an aluminum oxide ($Al_2O_3$) film having a refractive index of 1.62 and a film thickness of $Cd_2$; where the symbols "O", "A", "B", and "C" indicate variables.

In the multilayer film 28, an interface surface of the first film 29 is in close contact with the front end face of the semiconductor laser element 101. A surface of the seventh film 35, on the other hand, is in contact with exterior space (ambient atmosphere) 102 composed of air, nitrogen, or free space. Thus, the multilayer film 28 of the present embodiment has a structure in which three (sub-) multilayer films are laminated on a film with a low refractive index, each (sub-) multilayer film including a film with a high refractive index and a film with a low refractive index.

Figure 12:
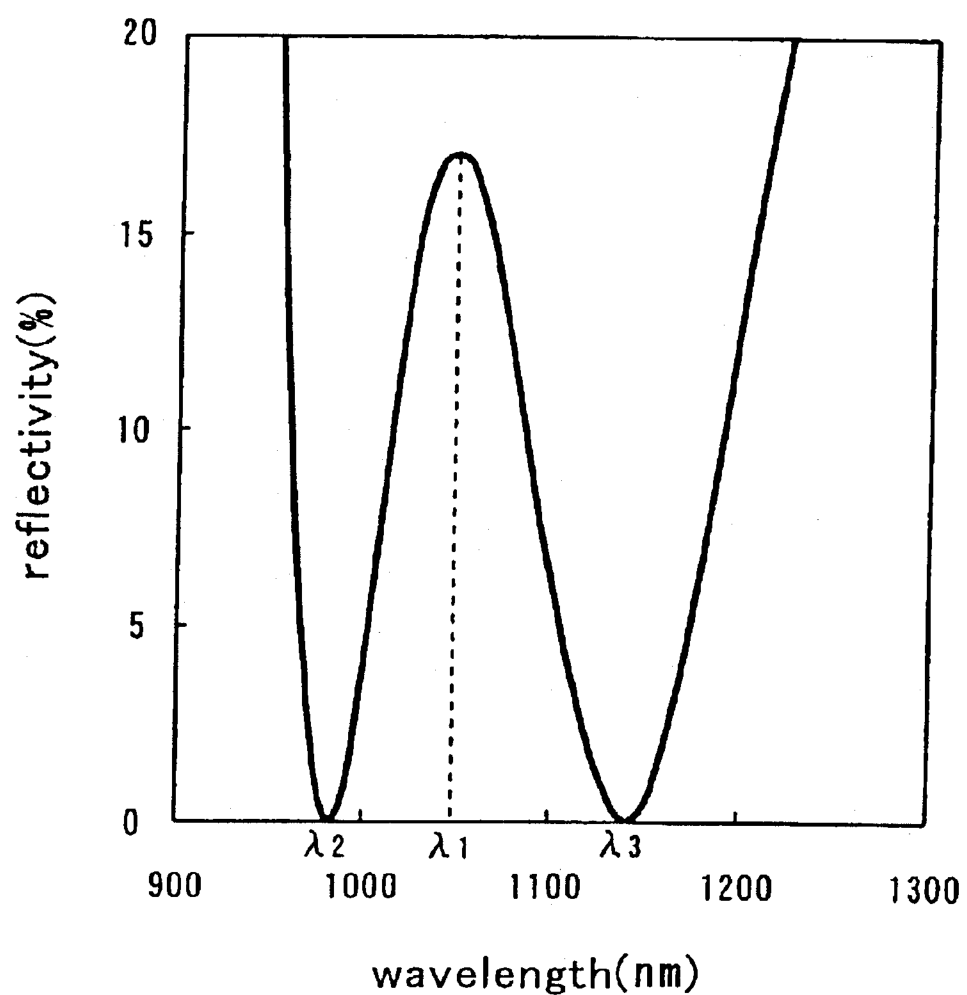
FIG. 12 shows wavelength dependence of reflectivity of a multilayer film according to the third embodiment.

The nonreflective conditions for the multilayer film of the present embodiment may be derived in the same manner as in the first embodiment. Assume the following: the effective refractive index $n_c$ of the semiconductor laser element 101 is 3.37; and O=0.8, A=4.0, B=4.0, and C=2.72. In such a case, no reflection occurs at the wavelength $\lambda_2$ (980 nm) when the phase change $\phi_1$ of silicon (Si) and the phase change $\phi_2$ of aluminum oxide ($Al_2O_3$) are 0.230093 and 1.12632, respectively. The reflectance has a maximum value at the wavelength $\lambda_1$ (1045 nm). The parameters $d_1$ to $d_7$ are such that $d_1$=86.75 nm, $d_2$=48.60 nm, $d_3$=433.76 nm, $d_4$=48.60 nm, $d_5$=433.76 nm, $d_6$=33.05 nm, and $d_7$=294.96 nm. FIG. 12 shows the wavelength dependence of the reflectivity obtained with the above arrangement.

As shown in FIG. 12, the reflectivity of the multilayer film of the present embodiment is maximized at the wavelength $\lambda_1$ (1045 nm), reaching a value of approximately 17%. The reflectivity then rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 12, the reflectivity is reduced to zero at both wavelengths $\lambda_2$ and $\lambda_3$.

Therefore, the multilayer film of the present embodiment may be provided on the front end face of a semiconductor laser element, and a film having an appropriately high reflectivity may be provided on the back end face facing the front end face. With this arrangement, the semiconductor laser can stably oscillate around the wavelength 1045 nm.

Furthermore, the reflectivity of the multilayer film of the present embodiment has a large value (is maximized) at a specific wavelength set in a low-reflective wavelength region, making it possible to reflect light of this specific wavelength. The reflected light can be amplified to generate laser oscillation by further reflecting the light within the semiconductor laser element repeatedly. Thus, it is possible to stably extract from the semiconductor laser element itself laser light whose wavelength exhibits only a small change, without using any fiber grating.

The multilayer film of the present embodiment may be applied to a semiconductor laser whose oscillation wavelength $\lambda$ is different (from that in the above example), as follows. In the case of a semiconductor laser whose oscillation wavelength $\lambda$ is 980 nm, the reflectivity of the multilayer film may be set such that it is maximized at the wavelength 980 nm.

Figure 13:
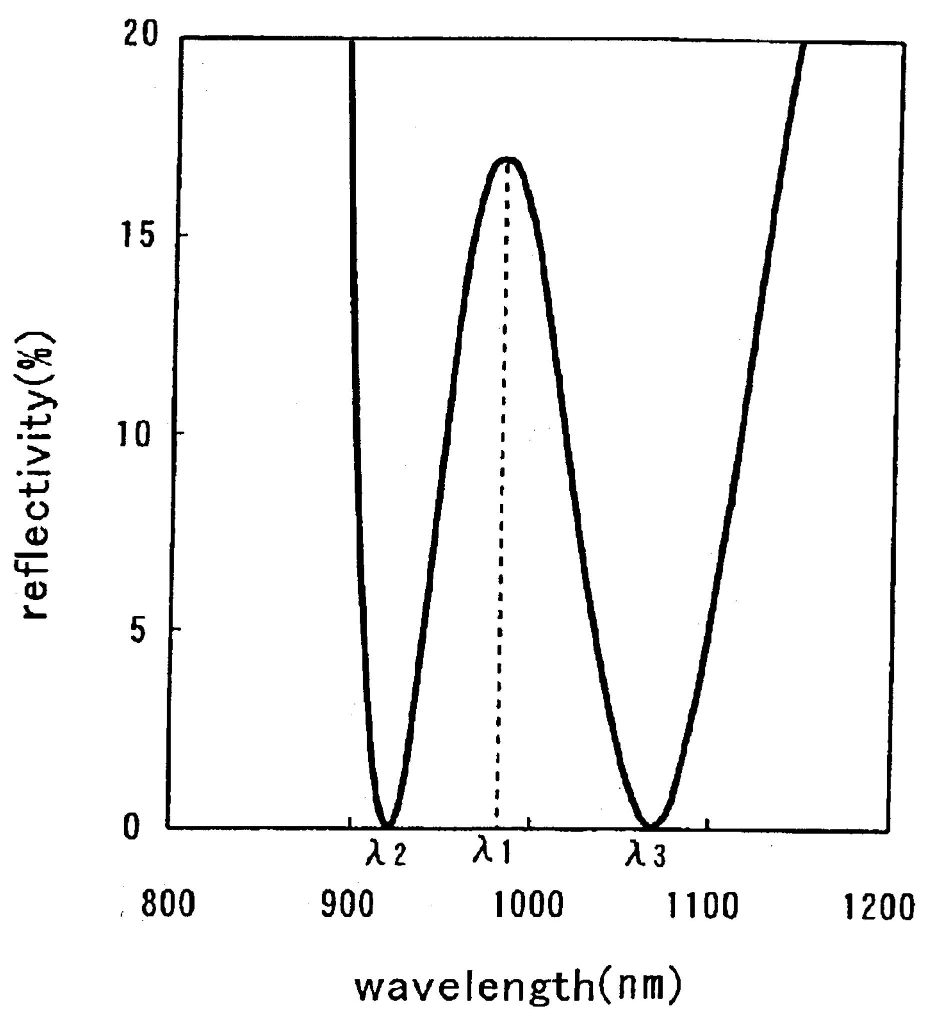
FIG. 13 shows wavelength dependence of reflectivity of a multilayer film according to the third embodiment.

Specifically, the phase change $\phi_1$ of the silicon (Si) and the phase change $\phi_2$ of the aluminum oxide ($Al_2O_3$) may be set to 0.230093 and 1.12632, respectively, so that no reflection occurs at the wavelength 919 nm. With this arrangement, the reflectivity can be maximized at the wavelength $\lambda_1$ (980 nm) as shown in FIG. 13. At that time, the reflectivity is approximately 17%. As in the above example, the reflectivity rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 13, the reflectivity is reduced to zero at both wavelengths $\lambda_2$ and $\lambda_3$. It should be noted that the parameters $d_1$ to $d_7$ for the first to seventh films, respectively, are such that $d_1$=81.35 nm, $d_2$=45.57 nm, $d_3$=406.76 nm, $d_4$=45.57 nm, $d_5$=406.76 nm, $d_6$=30.99 nm, and $d_7$=276.60 nm.

In the above description of the present embodiment, a multilayer film is formed on the front end face of a semiconductor laser element. However, the present invention is not limited to this specific arrangement. The multilayer film of the present embodiment can be applied to any arrangement employed to stably extract light of a specific wavelength. For example, the multilayer film may be formed on only the back end face of a semiconductor laser element, or it may be formed on both the front and the back end faces, depending on the application.

The multilayer film of the present embodiment can be formed on an end face of a semiconductor laser element by use of, for example, the EB (Electron Beam) deposition method, the sputtering method, the thermal CVD method, etc. The multilayer film of the present embodiment has good adhesion to an end face of a semiconductor laser and does not exhibit the problem of peel-off, etc. even after long use. Furthermore, the multilayer film has good resistance to heat generated due to absorption of light.

Fourth Embodiment

A multilayer film of a fourth embodiment is made up of seven films formed in layers each made of silicon dioxide ($SiO_2$) having a low refractive index or tantalum pentoxide ($Ta_2O_5$) having a high refractive index.

Figure 14:
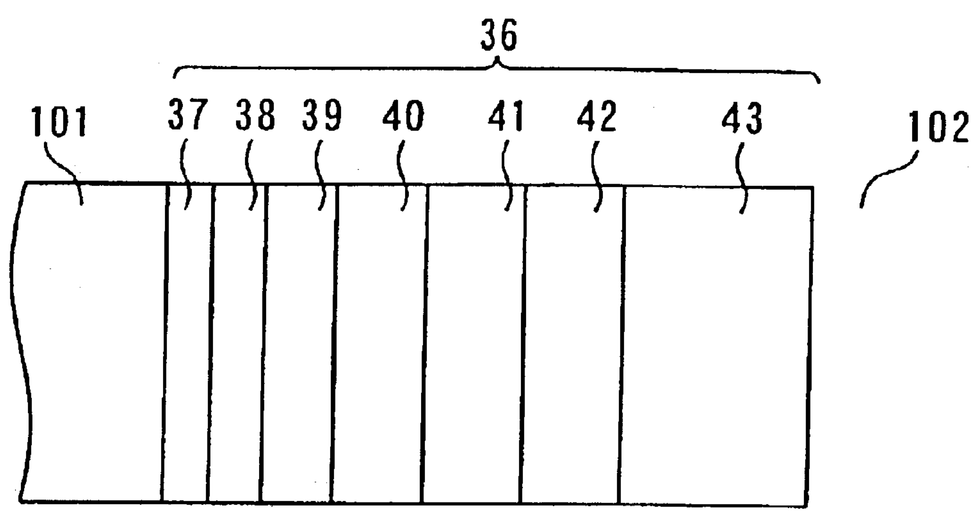
FIG. 14 is a cross-sectional view of a semiconductor laser element according to the fourth embodiment.

FIG. 14 is a cross-sectional view of a portion of a semiconductor laser element according to the present embodiment, the portion being a neighborhood of an end face of the semiconductor laser element. In the figure, a multilayer film 36 of the present embodiment is formed on a surface of a semiconductor laser element 101 having an effective refractive index of $n_c$. The multilayer film 36 comprises first, second, third, fourth, fifth, sixth, and seventh films. The first film 37 is an silicon dioxide ($SiO_2$) film having a refractive index of 1.45 and a film thickness of $Od_2$; the second film 38 is a tantalum pentoxide ($Ta_2O_5$) film having a refractive index of 2.057 and a film thickness of $Ad_1$; the third film 39 is an silicon dioxide ($SiO_2$) film having a refractive index of 1.45 and a film thickness of $Ad_2$; the fourth film 40 is a tantalum pentoxide ($Ta_2O_5$) film having a refractive index of 2.057 and a film thickness of $Bd_1$; the fifth film 41 is an silicon dioxide ($SiO_2$) film having a refractive index of 1.45 and a film thickness of $Bd_2$; the sixth film 42 is a tantalum pentoxide ($Ta_2O_5$) film having a refractive index of 2.057 and a film thickness of $Cd_1$; and the seventh film 43 is an silicon dioxide ($SiO_2$) film having a refractive index of 1.45 and a film thickness of $Cd_2$; where the symbols "O", "A", "B", and "C" indicate variables.

In the multilayer film 36, an interface surface of the first film 37 is in close contact with the front end face of the semiconductor laser element 101. A surface of the seventh film 43, on the other hand, is in contact with exterior space (ambient atmosphere) 102 composed of air, nitrogen, or free space. Thus, the multilayer film 36 of the present embodiment has a structure in which three (sub-) multilayer films are laminated on a film with a low refractive index, each (sub-) multilayer film including a film with a high refractive index and a film with a low refractive index.

Figure 15:
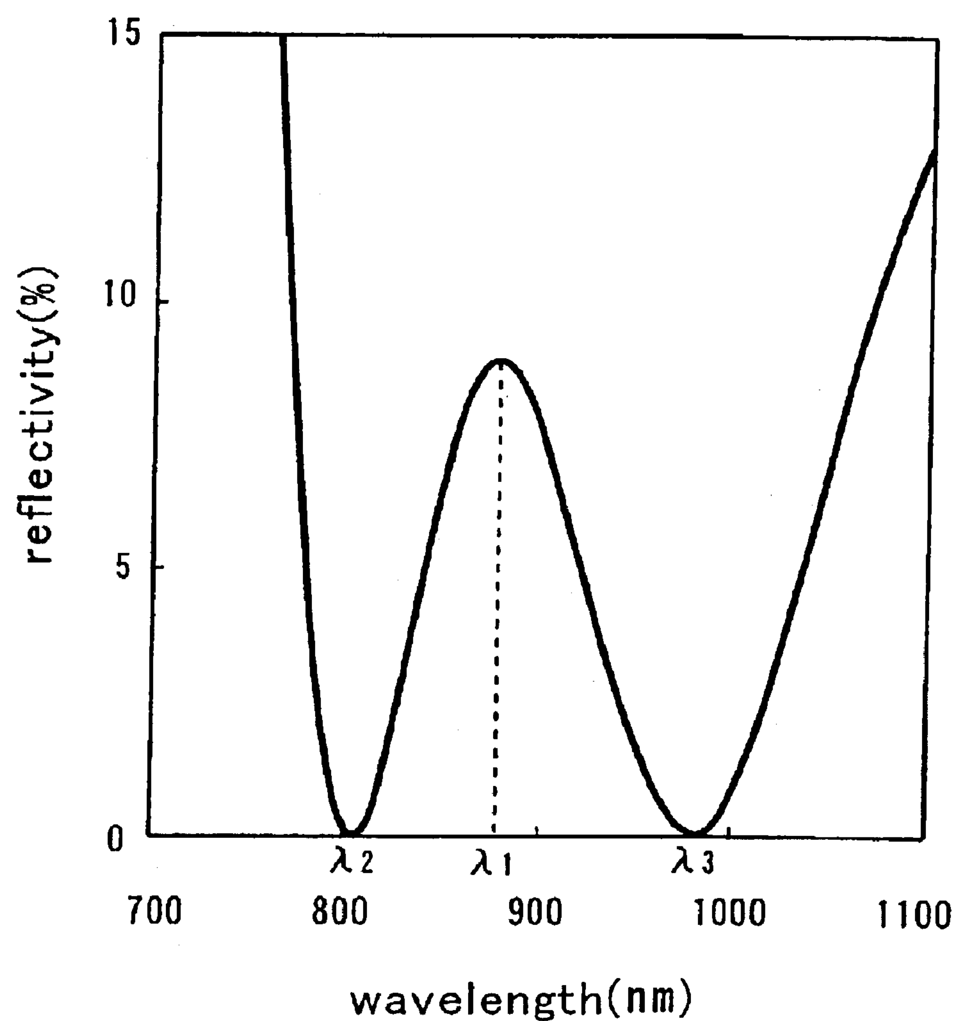
FIG. 15 shows wavelength dependence of reflectivity of a multilayer film according to the fourth embodiment.

The nonreflective conditions for the multilayer film of the present embodiment may be derived in the same manner as in the case of the first embodiment. For example, assume the following: the effective refractive index $n_c$ of the semiconductor laser element 101 is 3.37; and O=0.08, A=2.3, B=3.0, and C=1.95. In such a case, no reflection occurs at the wavelength $\lambda_3$ (980 nm) when the phase change $\phi_1$ of tantalum pentoxide ($Ta_2O_5$) and the phase change $\phi_2$ of silicon dioxide ($SiO_2$) are 0.261517 and 1.25002, respectively. The reflectivity has a maximum value at the wavelength $\lambda_1$ (879 nm). The parameters $d_1$ to $d_7$ are such that $d_1$=10.76 nm, $d_2$=45.61 nm, $d_3$=309.26 nm, $d_4$=59.49 nm, $d_5$=403.38 nm, $d_6$=38.67 nm, and $d_7$=262.20 nm. FIG. 15 shows the wavelength dependence of the reflectivity obtained with the above arrangement.

As shown in FIG. 15, the reflectivity of the multilayer film of the present embodiment is maximized at the wavelength $\lambda_1$ (879 nm), reaching a value of approximately 9%. The reflectivity then rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 15, the reflectivity is reduced to zero at the wavelength $\lambda_3$, and to less than 1% at the wavelength $\lambda_2$.

Therefore, the multilayer film of the present embodiment may be provided on the front end face of a semiconductor laser element, and a film having an appropriately high reflectivity may be provided on the back end face facing the front end face. With this arrangement, the semiconductor laser can stably oscillate around the wavelength 897 nm.

Furthermore, the reflectivity of the multilayer film of the present embodiment has a large value (is maximized) at a specific wavelength set in a low-reflective wavelength region, making it possible to reflect light of this specific wavelength. The reflected light can be amplified to generate laser oscillation by further reflecting the light within the semiconductor laser element repeatedly. Thus, it is possible to stably extract from the semiconductor laser element itself laser light whose wavelength exhibits only a small change, without using any fiber grating.

The multilayer film of the present embodiment may be applied to a semiconductor laser whose oscillation wavelength $\lambda$ is different (from that in the above example), as follows. For example, in the case of a semiconductor laser whose oscillation wavelength $\lambda$ is 980 nm, the reflectivity of the multilayer film may be set such that it is maximized at the wavelength 980 nm.

Figure 16:
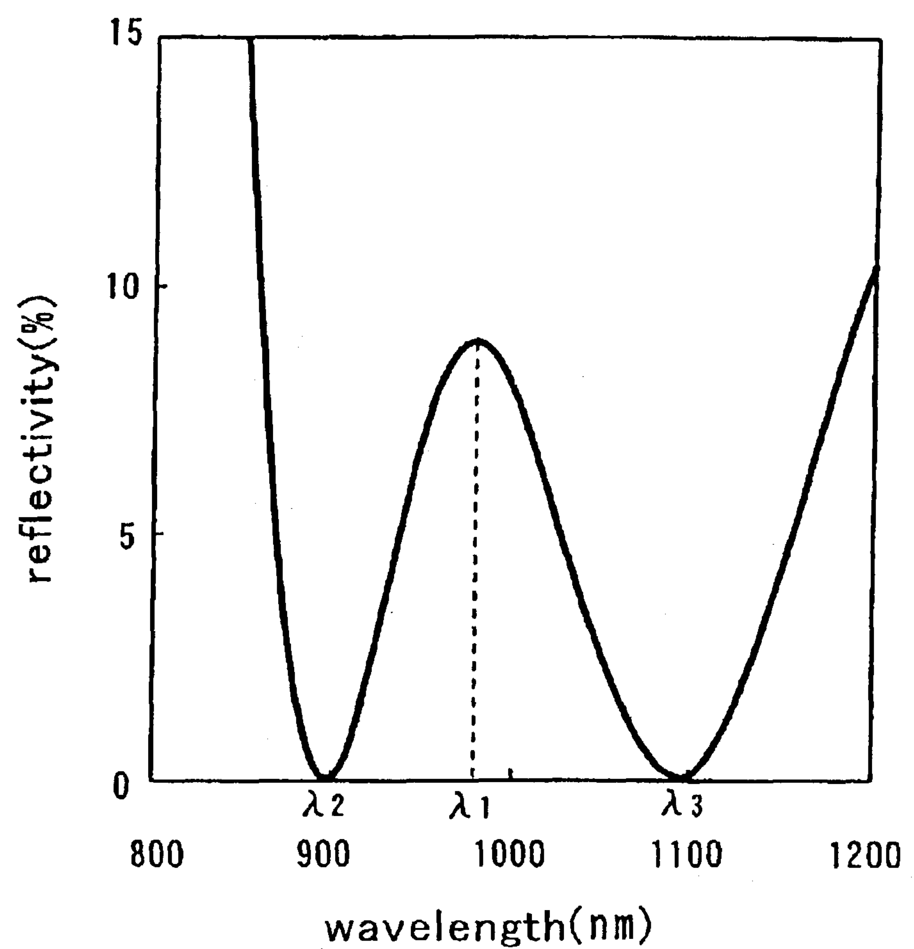
FIG. 16 shows wavelength dependence of reflectivity of a multilayer film according to the fourth embodiment.
Figure 1:
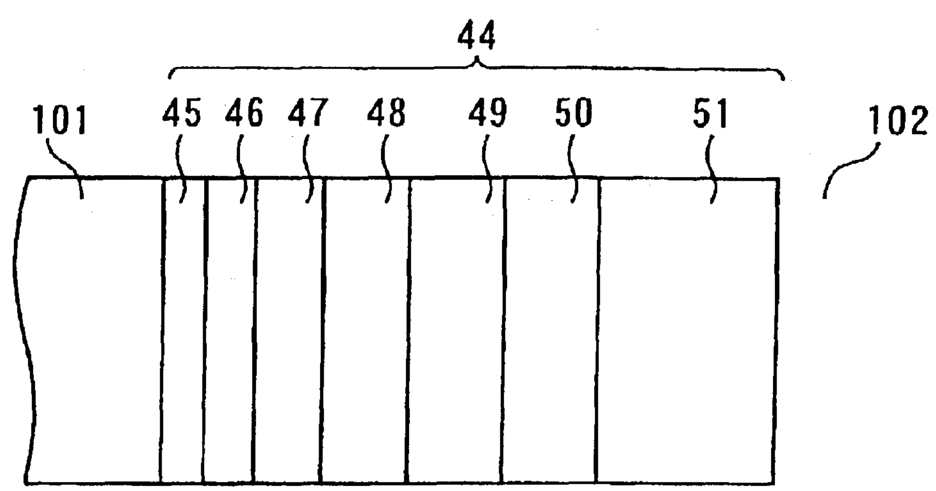

Specifically, the phase change $\phi_1$ of the tantalum pentoxide ($Ta_2O_5$) and the phase change $\phi_2$ Of the silicon dioxide ($SiO_2$) may be set to 0.261517 and 1.25002, respectively, so that no reflection occurs at the wavelength 1093 nm. With this arrangement, the reflectivity can be maximized at the wavelength $\lambda_1$ (980 nm) as shown in FIG. 16. As in the above example, the reflectivity rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. In the example of FIG. 16, the reflectivity is reduced to zero at the wavelength $\lambda_3$, and to less than 1% at the wavelength $\lambda_2$. It should be noted that the parameters $d_1$ to $d_7$ for the first to seventh films, respectively, are such that $d_1$=12.00 nm, $d_2$=50.87 nm, $d_3$=344.92 nm, $d_4$=66.35 nm, $d_5$=449.90 nm, $d_6$=43.13 nm, and $d_7$=292.43 nm.

In the above description of the present embodiment, a multilayer film is formed on the front end face of a semiconductor laser element. However, the present invention is not limited to this specific arrangement. The multilayer film of the present embodiment can be applied to any arrangement employed to stably extract light of a specific wavelength. For example, the multilayer film may be formed on only the back end face of a semiconductor laser element, or it may be formed on both the front and the back end faces, depending on the application.

The multilayer film of the present embodiment can be formed on an end face of a semiconductor laser element by use of, for example, the EB (Electron Beam) deposition method, the sputtering method, the thermal CVD method, etc. The multilayer film of the present embodiment has good adhesion to an end face of a semiconductor laser and does not exhibit the problem of peel-off, etc. even after long use. Furthermore, the multilayer film has good resistance to heat generated due to absorption of light.

Fifth Embodiment

A multilayer film of a fifth embodiment is made up of seven films formed in layers each made of silicon dioxide ($SiO_2$) having a low refractive index or silicon (Si) having a high refractive index.

FIG. 17 is a cross-sectional view of a portion of a semiconductor laser according to the present embodiment, the portion being a neighborhood of an end face of the semiconductor laser. In the figure, a multilayer film 44 is formed on a surface of a semiconductor laser element 101 having an effective refractive index of $n_c$. The multilayer film 44 comprises first, second, third, fourth, fifth, sixth, and seventh films. The first film 45 is an silicon dioxide ($SiO_2$) film having a refractive index of 1.45 and a film thickness of $Od_2$; the second film 46 is a silicon (Si) film having a refractive index of 2.954 and a film thickness of $Ad_1$; the third film 47 is an silicon dioxide ($SiO_2$) film having a refractive index of 1.45 and a film thickness of $Ad_2$; the fourth film 48 is a silicon (Si) film having a refractive index of 2.954 and a film thickness of $Bd_1$; the fifth film 49 is an silicon dioxide ($SiO_2$) film having a refractive index of 1.45 and a film thickness of $Bd_2$; the sixth film 50 is a silicon (Si) film having a refractive index of 2.954 and a film thickness of $Cd_1$; and the seventh film 51 is an silicon dioxide ($SiO_2$) film having a refractive index of 1.45 and a film thickness of $Cd_2$; where the symbols "O", "A", "B", and "C" indicate variables.

In the multilayer film 44, an interface surface of the first film 45 is in close contact with the front end face of the semiconductor laser element 101. A surface of the seventh film 51, on the other hand, is in contact with exterior space (ambient atmosphere) 102 composed of air, nitrogen, or free space. Thus, the multilayer film 44 of the present embodiment has a structure in which three (sub-) multilayer films are laminated on a film with a low refractive index, each (sub-) multilayer film including a film with a high refractive index and a film with a low refractive index.

Figure 18:
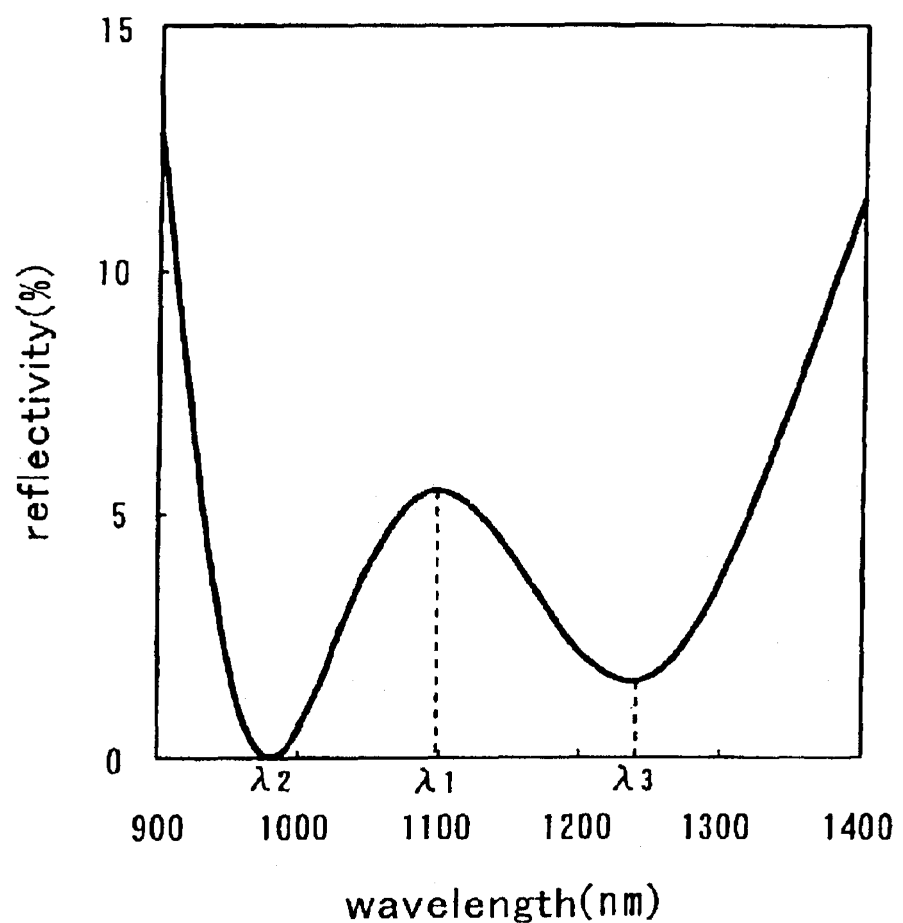
FIG. 18 shows wavelength dependence of reflectivity of a multilayer film according to the fifth embodiment.

The nonreflective conditions for the multilayer film of the present embodiment may be derived in the same manner as in the case of the first embodiment. For example, assume the following: the effective refractive index $n_c$ of the semiconductor laser is 3.37; and O=0.4, A=3.5, B=1.75, and C=2.5. In such a case, no reflection occurs at the wavelength $\lambda$ (980 nm) when the phase change $\phi_1$ of silicon (Si) and the phase change $\phi_2$ of silicon dioxide ($SiO_2$) are 0.104677 and 1.15475, respectively. The reflectivity has a maximum value at the wavelength $\lambda$ (1099 nm). The parameters $d_1$ to $d_7$ are such that $d_1$=49.69 nm, $d_2$=19.34 nm, $d_3$=434.75 nm, $d_4$=9.67 nm, $d_5$=217.37 nm, $d_6$=13.82 nm, and $d_7$=310.53 nm. FIG. 18 shows the wavelength dependence of the reflectivity obtained with the above arrangement.

As shown in FIG. 18, the reflectivity of the multilayer film of the present embodiment is maximized at the wavelength $\lambda_1$ (1099 nm). The reflectivity rapidly decreases when the wavelength is shifted from the wavelength $\lambda_1$ (toward either the shorter-wavelength side or the longer-wavelength side) even by a small amount, and the reflectance is minimized at the wavelengths $\lambda_2$ and $\lambda_3$, Therefore, the multilayer film of the present embodiment may be provided on the front end face of a semiconductor laser element, and a film having an appropriately high reflectivity may be provided on the back end face facing the front end face. With this arrangement, the semiconductor laser can stably oscillate around the wavelength 1099 nm.

Furthermore, the reflectivity of the multilayer film of the present embodiment has a large value (is maximized) at a specific wavelength set in a low-reflective wavelength region, making it possible to reflect light of this specific wavelength. The reflected light can be amplified to generate laser oscillation by further reflecting the light within the semiconductor laser element repeatedly. Thus, it is possible to stably extract from the semiconductor laser element itself laser light whose wavelength exhibits only a small change, without using any fiber grating.

The multilayer film of the present embodiment may be applied to a semiconductor laser whose oscillation wavelength λ is different (from that in the above example), as follows. For example, in the case of a semiconductor laser whose oscillation wavelength λ is 980 nm, the reflectivity of the multilayer film may be set such that it is maximized at the wavelength 980 nm.

Figure 19:
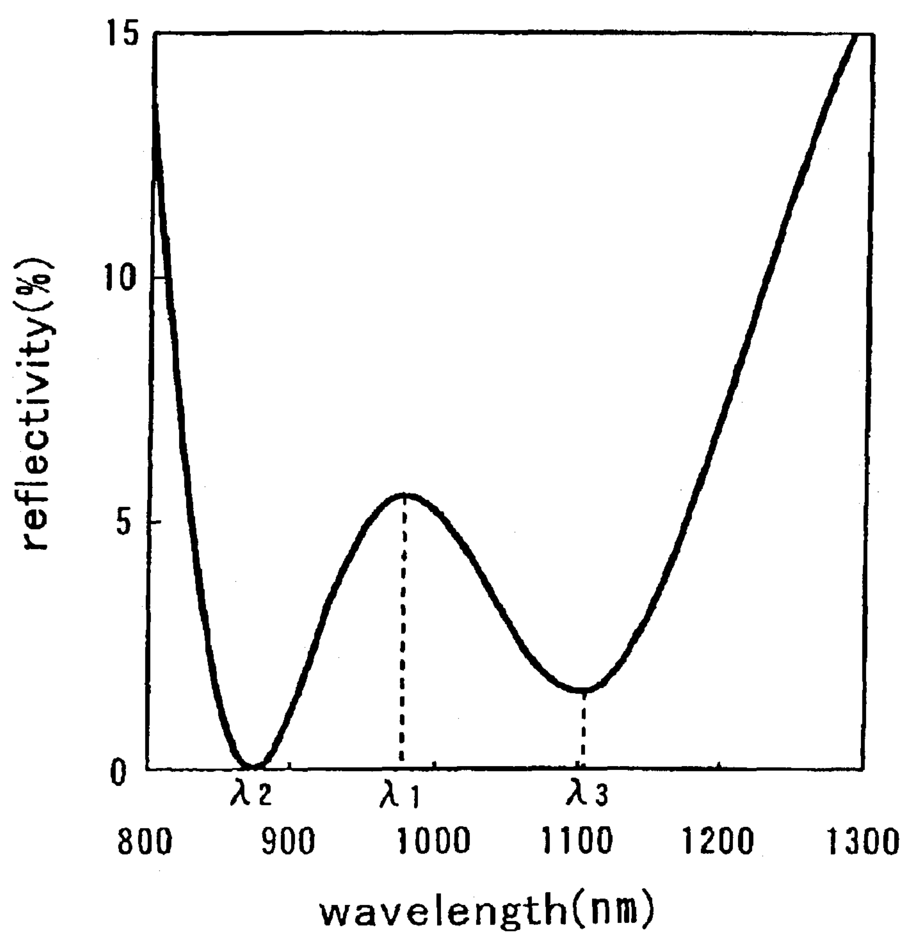
FIG. 19 shows wavelength dependence of reflectivity of a multilayer film according to the fifth embodiment.
Figure 20:
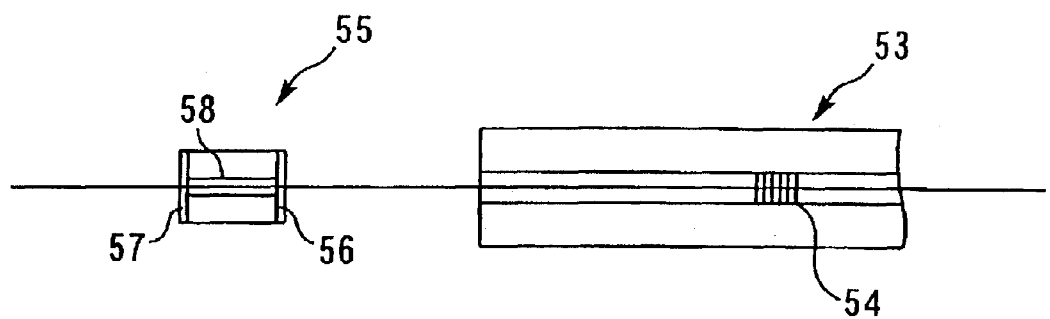
FIG. 20 is a block diagram of a conventional semiconductor laser.

Specifically, the phase change $\phi_1$ of the silicon (Si) and the phase change $\phi_2$ of the silicon dioxide ($SiO_2$) may be set to 0.104677 and 1.15475, respectively, so that no reflection occurs at the wavelength 874 nm. With this arrangement, the reflectivity can be maximized at the wavelength $\lambda_1$ (980 nm) as shown in FIG. 19. As in the above example, the reflectivity rapidly decreases when the wavelength is shifted from the wavelength $\lambda_1$ (toward either the shorter-wavelength side or the longer-wavelength side) even by a small amount, and the reflectivity is minimized at the wavelengths $\lambda_2$ and $\lambda_3$. It should be noted that the parameters $d_1$ to $d_7$ for the first to seventh films, respectively, are such that $d_1$=44.31 nm, $d_2$=17.25 nm, $d_3$=387.72 nm, $d_4$=8.63 nm, $d_5$=193.86 nm, $d_6$=12.32 nm, and $d_7$=276.95 nm.

In the above description of the present embodiment, a multilayer film is formed on the front end face of a semiconductor laser element. However, the present invention is not limited to this specific arrangement. The multilayer film of the present embodiment can be applied to any arrangement employed to stably extract light of a specific wavelength. For example, the multilayer film may be formed on only the back end face of a semiconductor laser element, or it may be formed on both the front and the back end faces, depending on the application.

The multilayer film of the present embodiment can be formed on an end face of a semiconductor laser element by use of, for example, the EB (Electron Beam) deposition method, the sputtering method, the thermal CVD method, etc. The multilayer film of the present embodiment has good adhesion to an end face of a semiconductor laser and does not exhibit the problem of peel-off, etc. even after long use. Furthermore, the multilayer film has good resistance to heat generated due to absorption of light.

The values of the variables O, A, B, C, and D used in the first to fifth embodiments are not limited to those indicated in this specification. Other values may be used for these variables to produce the same reflectivity curves as those described above.

In the first to fifth embodiments, a multilayer film having seven layers or nine layers is employed. However, the present invention is not limited to these specific numbers of layers. A multilayer film having any plurality of layers may be used.

The value of the wavelength at which the reflectivity of a multilayer film of the present invention is maximized is not limited to those indicated in the first to fifth embodiments. According to the present invention, the reflectivity of a multilayer film can be set such that it has a maximum value at a wavelength in such a wavelength region as a visible, far-infrared, or infrared light region. Therefore, the present invention is effective in oscillating light of a desired specific wavelength.

The features and advantages of the present invention may be summarized as follows.

According to one aspect, the present invention makes it possible to stably extract from a semiconductor laser element itself laser light whose wavelength exhibits only a small change, without using any fiber grating.

According to another aspect, since the multilayer films of the present invention have good adhesion to an end face of a semiconductor laser, they do not exhibit the problem of peel-off, etc. even after long use. The multilayer films also has good resistance to heat generated due to absorption of light. Therefore, the present invention makes it possible to obtain a reliable semiconductor laser device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No.2002-247096, filed on Aug. 27, 2002 including specification, claims, drawings and summary, on which the Convention priority of the present application is based, are incorporated herein in its entirety.

What is claimed is:

1. A semiconductor laser device comprising:

a semiconductor laser element having an effective refractive index of $n_c$, a front end face through which light generated in the semiconductor laser is emitted, and a back end face at which the light is reflected back into the semiconductor laser; and a multilayer film on the front end face of said semiconductor laser element wherein, said multilayer film includes a first film with a refractive index of $n_1$ and a second film with a refractive index of $n_2$, alternately laminated, said first film being in contact with said first end face, and the refractive index $n_1$ and the refractive index $n_2$ satisfy $$n_1<(n_c)^{1/2}$$

$$n_2>(n_c)^{1/2}, \text{ and}$$

said multilayer film has a reflectivity varying with wavelength of light produced by said semiconductor laser element, the reflectivity having a local maximum at a wavelength $\lambda_1$ within a wavelength region and having respective minimums at wavelengths $\lambda_2$ and $\lambda_3$ on a shorter-wavelength side and a longer-wavelength side of the wavelength $\lambda_1$, the reflectivity increasing at wavelengths shorter than the wavelength $\lambda_2$ and at wavelengths longer than the wavelength $\lambda_3$.

2. The semiconductor laser device according to claim 1, wherein the reflectivity is at least 1% at the wavelength $\lambda_1$, and less than 1% at the wavelengths $\lambda_2$ and $\lambda_3$.

3. The semiconductor laser device according to claim 2, wherein the reflectivity is between 10% and 20% at the wavelength $\lambda_1$.

4. The semiconductor laser device according to claim 1 wherein said first film is aluminum oxide, and said second film is tantalum pentoxide.

5. The semiconductor laser device according to claim 1, wherein said first film is aluminum oxide, and said second film is silicon.

6. The semiconductor laser device according to claim 1, wherein said first film is silicon dioxide, and said second film is tantalum pentoxide.

7. The semiconductor laser device according to claim 1, wherein said first film is silicon dioxide, and said second film is silicon.

* * * * *